(12) United States Patent
Chen et al.

(10) Patent No.: US 11,349,047 B2
(45) Date of Patent: May 31, 2022

(54) LIGHT-EMITTING DEVICE

(71) Applicant: EPISTAR CORPORATION, Hsinchu (TW)

(72) Inventors: Yi-Ming Chen, Hsinchu (TW);
Hao-Min Ku, Hsinchu (TW);
Chih-Chiang Lu, Hsinchu (TW);
Tzu-Chieh Hsu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 17/114,012

(22) Filed: Dec. 7, 2020

(65) Prior Publication Data

US 2021/0119078 A1    Apr. 22, 2021

Related U.S. Application Data

(63) Continuation of application No. 16/673,312, filed on Nov. 4, 2019, now Pat. No. 10,892,380, which is a continuation of application No. 15/793,611, filed on Oct. 25, 2017, now abandoned, which is a continuation of application No. 14/261,368, filed on Apr. 24, 2014, now Pat. No. 9,831,384.

(30) Foreign Application Priority Data

Apr. 25, 2013   (TW) .................................. 10211498

(51) Int. Cl.
*H01L 33/10* (2010.01)
*H01L 33/40* (2010.01)
*H01L 33/38* (2010.01)

(52) U.S. Cl.
CPC ............ *H01L 33/10* (2013.01); *H01L 33/405* (2013.01); *H01L 33/38* (2013.01)

(58) Field of Classification Search
CPC ....... H01L 33/10; H01L 33/26; H01L 33/405; H01L 33/38; H01L 33/0079; H01L 33/60; H01L 33/62; H01L 33/387
USPC ............................................... 257/94, 98, 29
See application file for complete search history.

(56) References Cited

U.S. PATENT DOCUMENTS

2007/0114545 A1\* 5/2007 Jang ...................... H01L 33/145
257/94
2010/0140637 A1\* 6/2010 Donofrio ................ H01L 33/42
257/98

(Continued)

FOREIGN PATENT DOCUMENTS

CN           101315959 A        12/2008

*Primary Examiner* — Mouloucoulaye Inoussa
(74) *Attorney, Agent, or Firm* — Ditthavong, Steiner & Mlotkowski

(57) ABSTRACT

This disclosure discloses a light-emitting device. The light-emitting device includes a light-emitting stack having a first-type semiconductor layer, a second-type semiconductor layer, and an active layer formed between the first-type semiconductor layer and the second-type semiconductor layer; and a reflective structure formed on the first-type semiconductor layer and having a first interface and a second interface. A critical angle at the first interface for a light emitted from the light-emitting stack is larger than that at the second interface. The reflective structure electrically connects to the first-type semiconductor layer at the first interface, and an area of the first interface is more than an area of the second interface in a top view.

20 Claims, 12 Drawing Sheets

(56) References Cited

U.S. PATENT DOCUMENTS

| | | |
|---|---|---|
| 2010/0224898 A1 | 9/2010 | Kazama |
| 2010/0230705 A1* | 9/2010 | Jeong .................. H01L 33/42 |
| | | 257/98 |
| 2010/0264442 A1* | 10/2010 | Lee .................... H01L 33/36 |
| | | 257/98 |
| 2010/0283081 A1 | 11/2010 | Huang et al. |
| 2011/0089452 A1* | 4/2011 | Jeong .................. H01L 33/44 |
| | | 257/98 |
| 2011/0108879 A1 | 5/2011 | Huang et al. |
| 2011/0133242 A1* | 6/2011 | Choi .................. H01L 33/38 |
| | | 257/99 |
| 2011/0168971 A1 | 7/2011 | Song |
| 2011/0175131 A1* | 7/2011 | Seo .................. H01L 33/0093 |
| | | 257/98 |
| 2011/0210359 A1 | 9/2011 | Park et al. |
| 2013/0032845 A1* | 2/2013 | Chuang ............ H01L 33/0093 |
| | | 257/99 |
| 2013/0037839 A1 | 2/2013 | Kazama |
| 2013/0153950 A1* | 6/2013 | Mizutani ............ H01L 33/40 |
| | | 257/99 |
| 2013/0228814 A1* | 9/2013 | Jeong .................. H01L 33/44 |
| | | 257/98 |
| 2014/0034989 A1* | 2/2014 | Choi .................. H01L 33/44 |
| | | 257/98 |
| 2014/0070247 A1* | 3/2014 | Yen .................... H01L 33/14 |
| | | 257/98 |

* cited by examiner

LIGHT-EMITTING DEVICE

REFERENCE TO RELATED APPLICATION

This application is a continuation of U.S. patent application Ser. No. 16/673,312, filed on Nov. 4, 2019, which is a continuation of U.S. patent application Ser. No. 15/793,611, filed on Oct. 25, 2017, which is a continuation of U.S. application Ser. No. 14/261,368, filed on Apr. 24, 2014, which claims priority to TW application Serial No. 102114988, filed on Apr. 25, 2013, each of which is incorporated by reference herein in its entirety.

BACKGROUND

Technical Field

The present disclosure relates to a light-emitting device, and in particular to a light-emitting device comprising a reflective structure.

Description of the Related Art

The light-emitting diodes (LEDs) of the solid-state lighting elements have the characteristics of low power consumption, low heat generation, long operational life, shock-proof, small volume, quick response and good opto-electrical property like light emission with a stable wavelength so the LEDs have been widely used in household appliances, indicator light of instruments, and opto-electrical products, etc. However, how to improve a lighting efficiency of the LEDs is still an important issue.

In addition, the LEDs can be further connected to other components (such as submount) in order to form a light emitting apparatus (ex. a light-emitting package structure). The light emitting apparatus comprise one submount with a circuit, a solder formed on the submount for mounting the LEDs on the submount such that a substrate of the LEDs is electrically connected to the circuit, and an electrical connection structure for electrically connecting bonding pads with the circuit. The submount can be a lead frame or a mounting substrate with a larger size for easily designing a circuit layout thereon and for increasing heat dissipation efficiency.

SUMMARY OF THE DISCLOSURE

The present disclosure provides a light-emitting device with a reflective structure.

A light-emitting device is provided, which includes a substrate, a bonding layer, a light-emitting stack, a reflective structure, a void, a first interface and a second interface. The bonding layer is on the substrate. The light-emitting stack includes a first-type semiconductor layer, a second-type semiconductor layer, and an active layer between the first-type semiconductor layer and the second-type semiconductor layer. The reflective structure is between the first-type semiconductor layer and the substrate. The void is between the substrate and the light-emitting stack. The first interface is between the substrate and the light-emitting stack. The second interface is on the void. The void is enclosed and embedded within the light-emitting device and directly connects to the bonding layer. The reflective structure electrically connects to the first-type semiconductor layer at the first interface. A critical angle at the first interface for a light emitted from the light-emitting stack is larger than that at the second interface.

Another light-emitting device is further provided, which includes a light-emitting stack, a reflective structure and a contact layer. The light-emitting stack includes a first-type semiconductor layer, a second-type semiconductor layer, and an active layer between the first-type semiconductor layer and the second-type semiconductor layer. The reflective structure is on the first-type semiconductor layer and having a first interface and a second interface. A critical angle at the first interface for a light emitted from the light-emitting stack is larger than that at the second interface. The contact layer is between the first-type semiconductor layer and the reflective structure. The contact layer includes metal or alloy. The reflective structure electrically connects to the first-type semiconductor layer at the first interface. The contact layer electrically connects to the first-type semiconductor layer.

Another light-emitting device is further provided, which includes a light-emitting stack, a reflective structure and a contact layer. The light-emitting stack includes a first-type semiconductor layer, a second-type semiconductor layer, and an active layer between the first-type semiconductor layer and the second-type semiconductor layer. The reflective structure is on the first-type semiconductor layer and having a first interface and a second interface. A critical angle at the first interface for a light emitted from the light-emitting stack is larger than that at the second interface. An area of the first interface is larger than an area of the second interface in a top view. The contact layer is between the first-type semiconductor layer and the reflective structure. The reflective structure electrically connects to the first-type semiconductor layer at the first interface. The contact layer electrically connects to the first-type semiconductor layer.

BRIEF DESCRIPTION OF THE DRAWING

The accompanying drawings are included to provide easy understanding of the application, and are incorporated herein and constitutes a part of this specification. The drawings illustrate the embodiments of the application and, together with the description, serves to illustrate the principles of the application.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure.

The following shows the description of embodiments of the present disclosure in accordance with the drawings.

Figure 1:
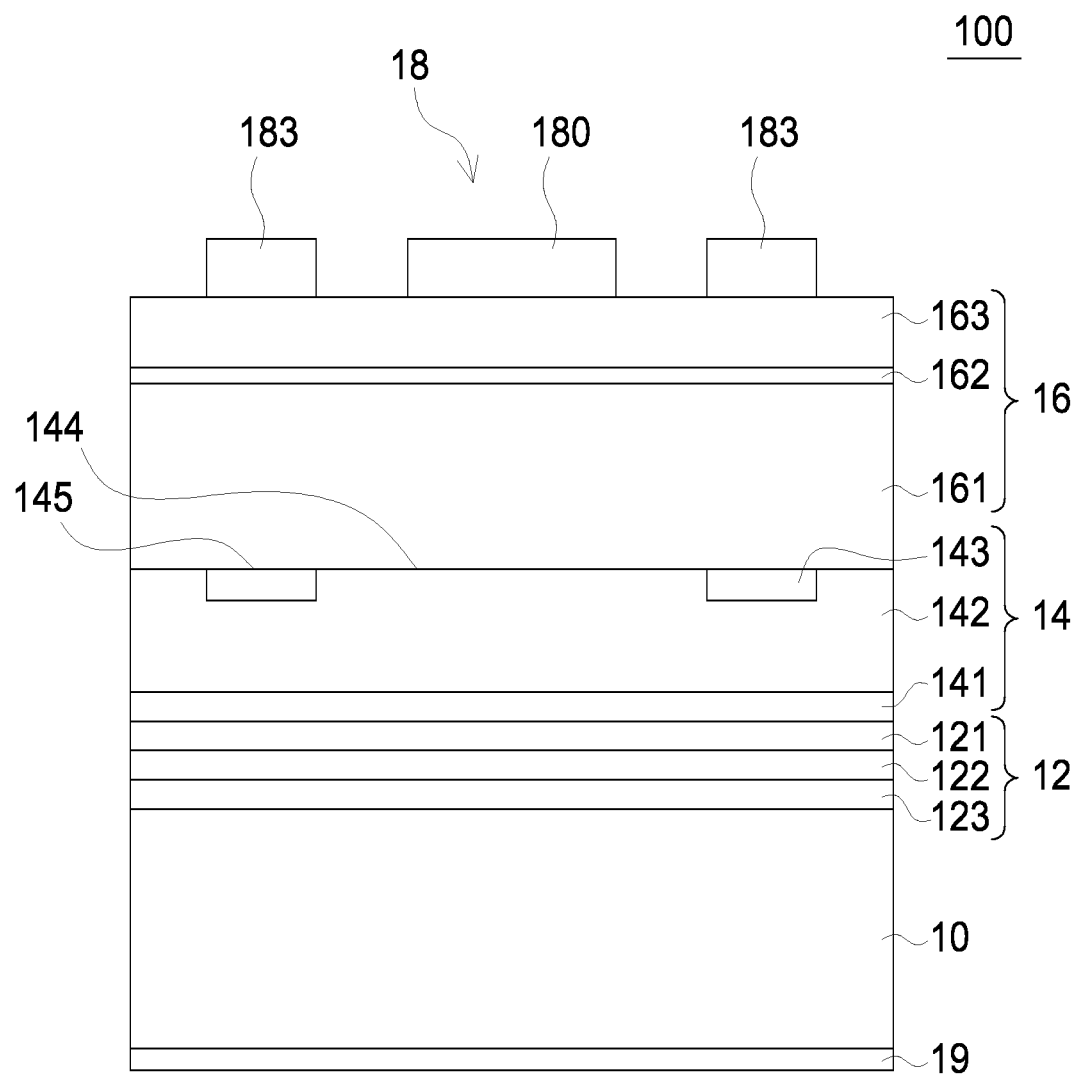
FIG. 1 shows a cross-sectional view of a light-emitting device in accordance with one embodiment of the present disclosure.

FIG. 1 is a cross-sectional view of a light emitting device 100 in accordance with one embodiment of the present disclosure. As shown in FIG. 1, the light-emitting device comprises a substrate 10, a bonding structure 12 formed on the substrate10, a reflective structure 14 formed on the bonding structure 12, a light-emitting stack 16 formed on the reflective structure 14, a first electrode 19 formed on the substrate 10 and a second electrode 18 formed on the light-emitting stack 16. The bonding structure 12 comprises a first bonding layer 121, a second bonding layer 12 and a third bonding layer 123. The reflective structure 14 comprises a metal layer 141 formed on the first bonding layer 121, a transparent conductive layer 142 formed on the metal layer 141, and a void 143 formed between the transparent conductive layer 142 and the light-emitting stack 16. The light-emitting stack 16 comprises a first-type semiconductor layer 161, an active layer 162 formed on the first-type semiconductor layer 161 and emitting a light, and a second-type semiconductor layer 163 formed on the active layer 162. The first-type semiconductor layer 161 and the second-type semiconductor layer 163, for example a cladding layer or a confinement layer, respectively provide electrons and holes such that electrons and holes can be combined in the light-emitting layer 162 to emit light. In this embodiment, the first-type semiconductor layer 161 directly contacts the transparent conductive layer 142 to form a first interface 144 therebetween, and the first-type semiconductor layer 161 directly contacts the void 143 to form a second interface 145 therebetween. The void 143 is formed within the transparent conductive layer 142 and does not directly contact the metal layer 141. Furthermore, the void 143 has a refractive index smaller than that of the transparent conductive layer 142. In other words, a difference of the refractive index between the first-type semiconductor layer 161 and the transparent conductive layer 142 is smaller than that between the first-type semiconductor layer 161 and the void 143. Therefore, when the light emitted by the active layer 162 progresses toward the reflective structure 14, a critical angle of the light at the first interface 144 is larger than that at the second interface 145, that is, the probability occurring the total internal reflection at the second interface 145 is larger than at the first interface 144. In addition, the first-type semiconductor layer 161 ohmically contacts the transparent conductive layer 142 at the first interface 144 and the first-type semiconductor layer 161 non-ohmically contacts the void 143 at the second interface 145.

Figure 2:
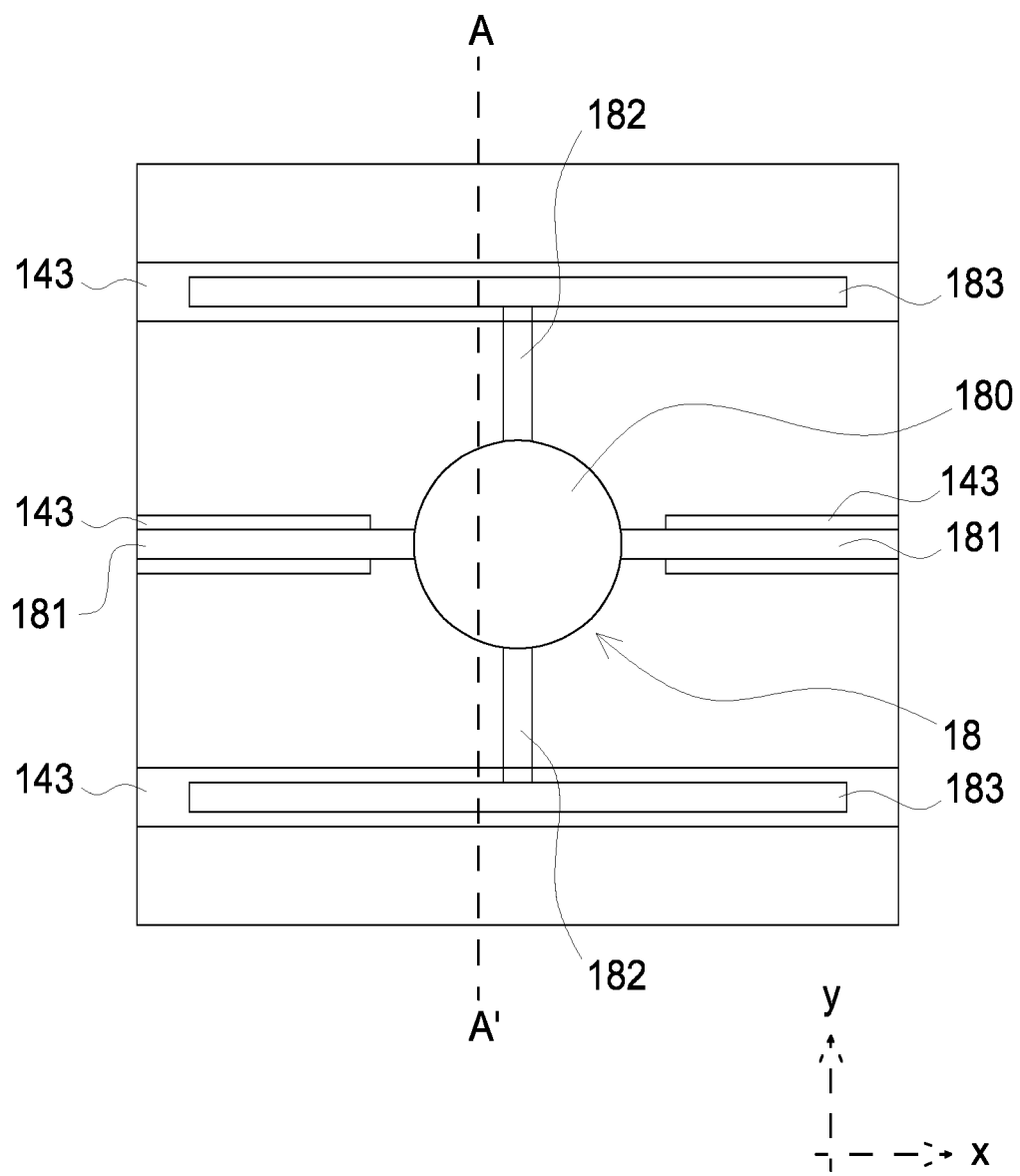
FIG. 2 shows a top view of the light-emitting device in accordance with one embodiment of the present disclosure.

FIG. 2 is a top view of the light-emitting device 100 in accordance to the embodiment of the present disclosure. FIG. 1 is a cross-sectional view taken along line AA' of FIG. 2. In this embodiment, the second electrode 18 has an electrode pad 180 and a plurality of first extension electrodes 181, a plurality of second extension electrodes 182 and a plurality of third extension electrodes 183. The plurality of first extension electrodes 181 extends from the electrode pad 180 along the X direction toward opposite sides (right and left) of the light-emitting device 100 and arranged in a line. The plurality of second extension electrodes 182 extends from the electrode pad 180 along the Y direction toward opposite sides (up and down) of the light-emitting device 100 and arranged in a line. The second extension electrodes 182 are perpendicular to the first extension electrodes 181. The plurality of third extension electrodes 183 is physically connected to the second extension electrodes 182 and electrically connected to the electrode pad 180. The third extension electrodes 183 are arranged in parallel with the first extension electrodes 181. The first extension electrodes 181 are disposed between the third extension electrodes 183. A distance between the first extension electrodes 183 and the third extension electrodes 181 can be the same or different. The void 143 are formed below portions of the first extension electrodes 181 and the third extension electrodes 183 and has a width larger than the corresponding first extension electrode 181 and the third extension electrode 183 in the Y direction. The void 143 is not formed below the electrode pad 180 and portions of the second extension electrodes 182. The void 143 is merely formed at a position corresponding to the extension electrodes 181, 183 and extends to two opposite sides of the light-emitting device 100. In this embodiment, the void 143 is not formed below the first extension electrode 181 close to the electrode pad 180. The void 143 corresponding to the third extension electrode 183 has a length larger than that of the third extension electrode 183 in the X direction. In another embodiment, the quantity and the arrangement of the electrode extensions can be varied depending on actual requirement.

In this embodiment, the first-type semiconductor layer 161 is a p-type semiconductor layer and the second-type semiconductor layer 163 is an n-type semiconductor layer. Alternatively, the first-type semiconductor layer 161 is an n-type semiconductor layer and the second-type semiconductor layer 163 is a p-type semiconductor layer. The first-type semiconductor layer 161 and the second-type semiconductor layer 162 comprise one of AlGaAs, AlGaInP, AlInP, InGaP, GaP, and GaAs, or one of AlInGaN, InGaN, AlGaN and GaN. The dopant in the p-type semiconductor layer comprises Mg, Be, Zn, C or combinations thereof. The dopant in the n-type semiconductor layer comprises Si, P, As, Sb or combinations thereof. The active layer 162 comprises one of AlGaAs, AlGaInP, AlInP, InGaP, GaP, and GaAs, or one of AlInGaN, InGaN, AlGaN and GaN. The active layer can have a structure including single heterostructure (SH), double heterostructure (DH), or double-side double heterostructure (DDH), or multi-quantum well (MQW) structure. The substrate comprises GaAs, GaP, Ge, sapphire, glass, diamond, SiC, Si, GaN, ZnO, or other suitable material. The metal layer can be a single layer or a multi-layer and comprises Ag, Al, Au, Ni or combinations thereof. The first bonding layer, the second bonding layer, and the third bonding layer can be a single layer or a multi-layer, and comprise a metal material or a glue material. The metal material comprises Au, In, Sn, Ti, Pt, or combination thereof. The glue material comprises BCB, epoxy, or PDMS, silicone ($SiO_x$), $Al_2O_3$, $TiO_2$, $SiN_x$ or combinations thereof. The transparent conductive layer can comprise metal oxide, such as ITO, InO, SnO, CTO, ATO, AZO, ZTO, GZO, ZnO, IZO, IGO, GAZO, or diamond-like carbon or GaP. The void can contain air, $N_2$, He, or Ar.

Figure 3A:
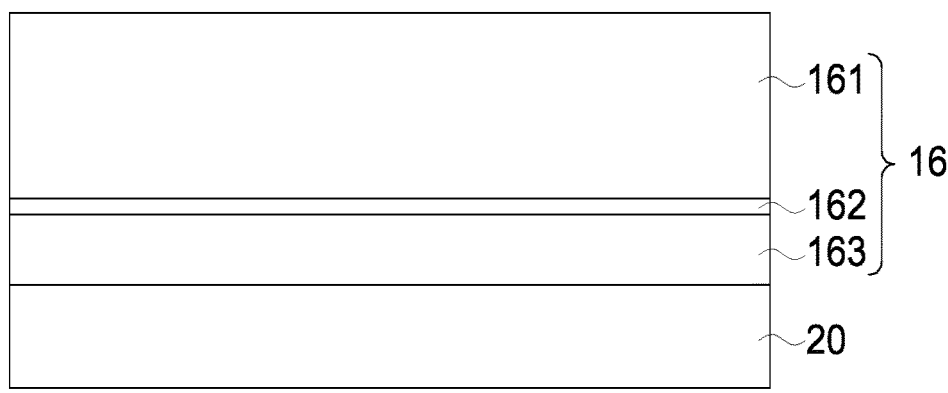
FIGS. 3A-3E are cross-sectional views illustrating a method of making a light-emitting device in accordance with one embodiment of the present disclosure.
Figure 3B:
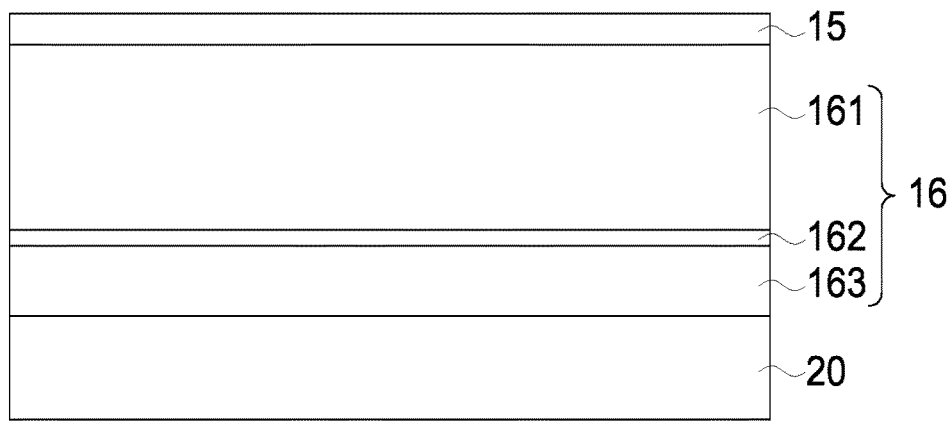
Figure 3C:
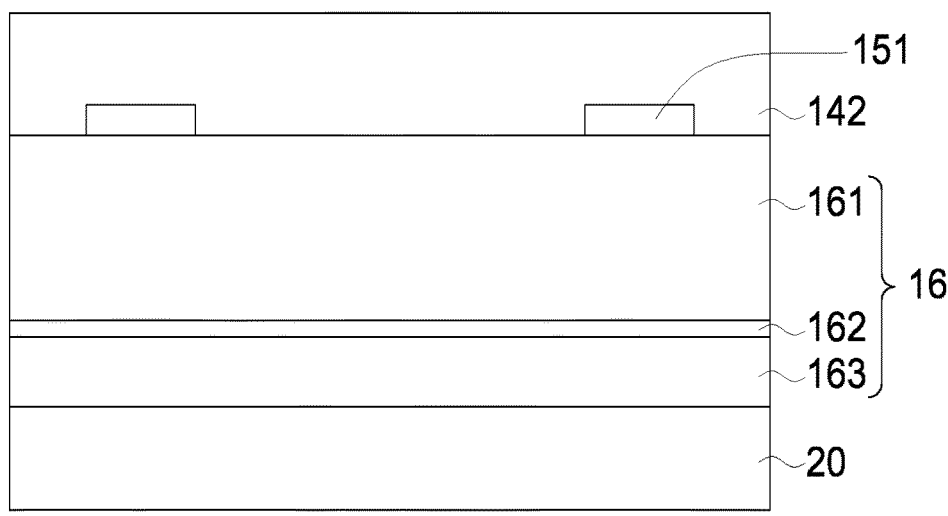
Figure 3D:
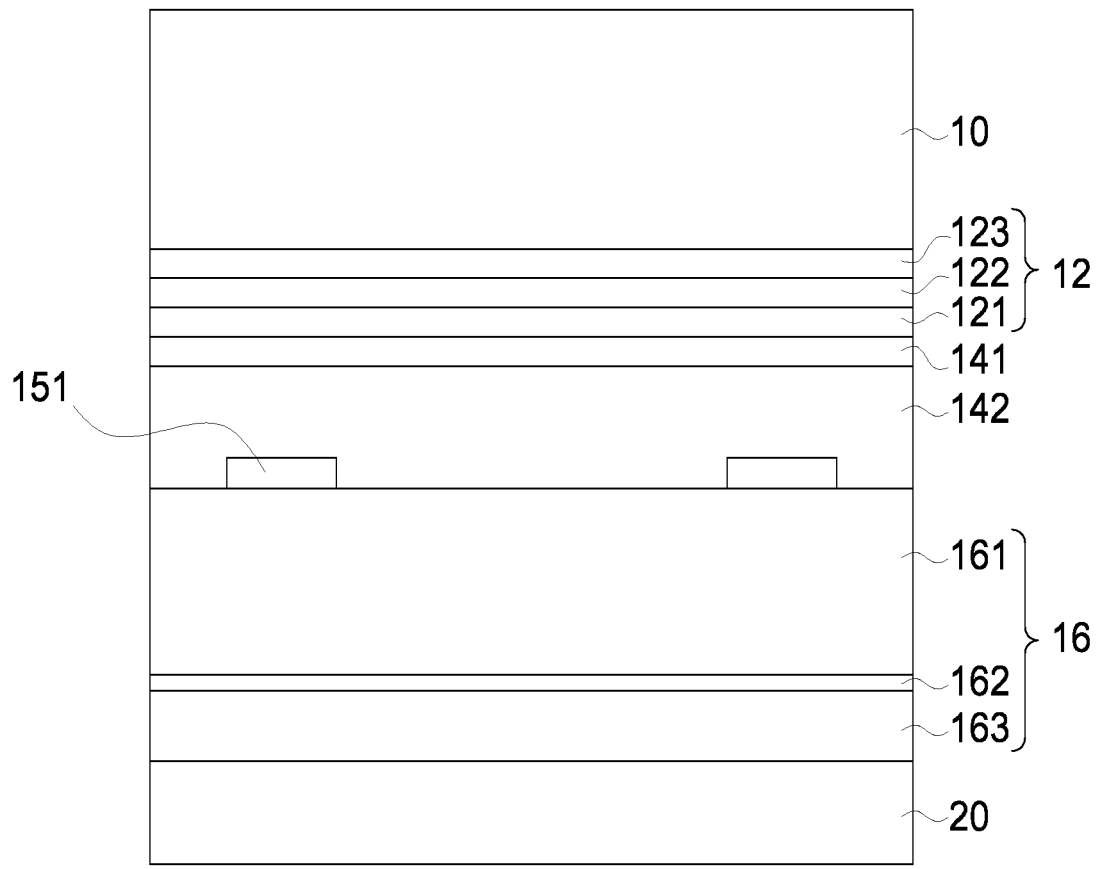
Figure 3E:
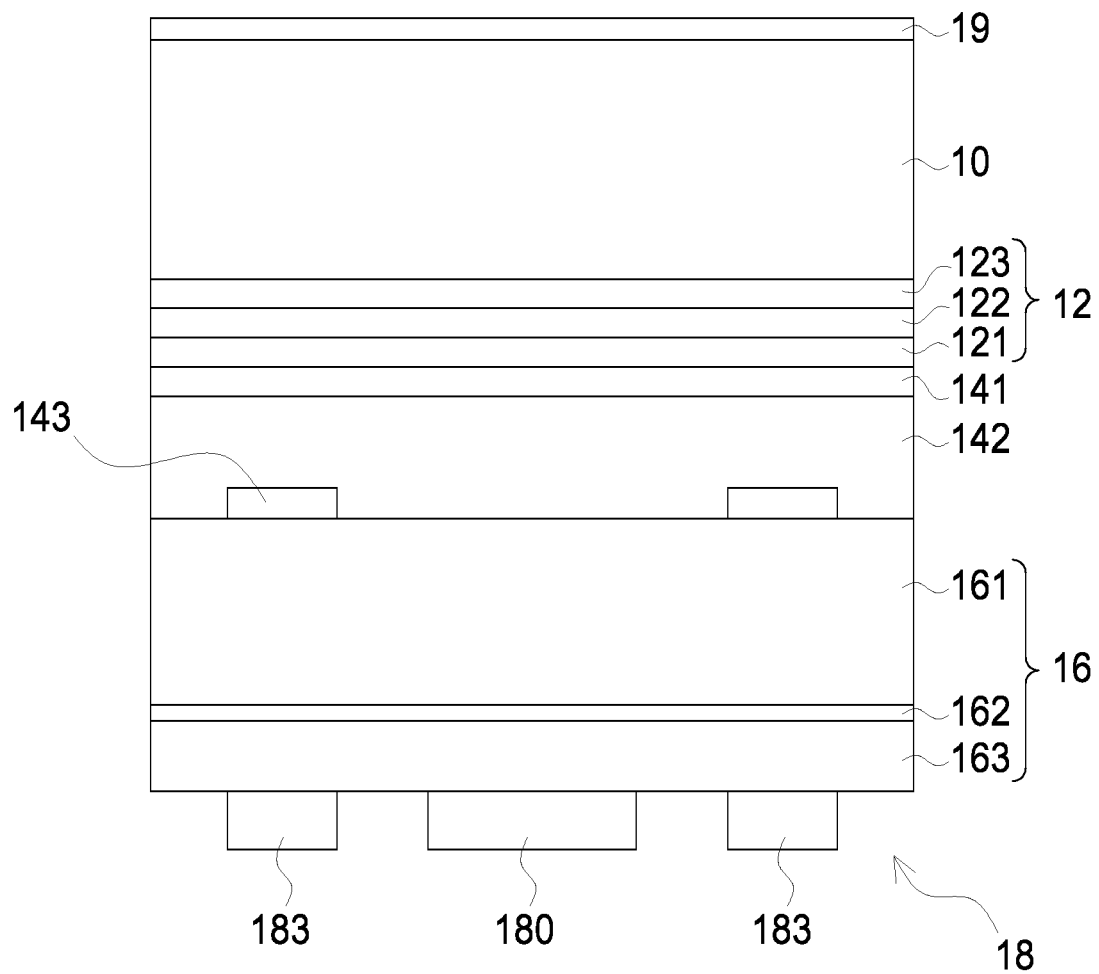

FIGS. 3A-3E are cross-sectional view showing a method of making the light-emitting device 100 in accordance with the embodiment of the present disclosure. As shown in FIG. 3A, a growth substrate 20 (for example, GaAs) is provided and a light-emitting stack 16 is epitaxially grown on the growth substrate 20. The light-emitting stack 16 sequentially includes the second-type semiconductor layer 163 (for example, AlGaInP), the active layer 162 (for example, AlGaInP) and the first-type semiconductor layer 161 (for example, GaP). As shown in FIG. 3B, a sacrificial layer 15 (for example, $SiO_2$) is formed on the first-type semiconductor layer 161. In another embodiment, the sacrificial layer 15 can comprise photoresistor, SiN$_x$, or metal (such as Ni). As shown in FIG. 3C, a lithography process is conducted to pattern the sacrificial layer 15 for forming a patterned sacrificial layer 151. A transparent conductive layer 142 (for example, ITO) is formed on the patterned sacrificial layer 151 and the first-type semiconductor layer 161 to enclose the patterned sacrificial layer 151 therein. As shown in FIG. 3D, a metal layer 141 (for example, Ag) is formed on the transparent conductive layer 142. The first bonding layer 121 and the second bonding layer 122 are formed on the metal layer 141. The third bonding layer is formed on a substrate (for example, Si). By bonding the second bonding layer 122 and the third bonding layer 123 together, the substrate 10 is boned to the metal layer 141. In another embodiment, the first bonding layer 121 comprises a multi-layer (for example, Ti/Pt/Au). Ti layer can be used as a barrier layer to prevent the metal of the metal layer 141 from diffusing into the bonding layer; Pt layer can be used as an adhesion layer to improve adhesion between Ti layer and Au layer. As shown in 3E, the patterned sacrificial layer 151 is removed using an etching method to form the void 143. The etching method comprises a vapor etching method or a liquid etching method. The vapor etching method can use vapor HF as an etchant, and the liquid etching method can use NaOH, HF, NH$_4$F or a mixture thereof as an etchant. After removing the growth substrate 20 to expose the second-type semiconductor layer 163, the first electrode 19 is formed on the substrate 10 and the second electrode 18 is formed on the second-type semiconductor layer 163. The second electrode 18 comprises the electrode pad 180 and the extension electrodes 183. The extension electrodes 183 are at positions corresponding to the voids 143. In another embodiment, the growth substrate can be removed and then the etching is conducted to remove the patterned sacrificial layer 151. It is noted that when the patterned sacrificial layer 151 is etched using the vapor etching method, since the vapor etching method does not includes liquid (such as water), the first-type semiconductor layer 161 and the transparent conductive layer 142 are not adhered to each other due to a surface force after removing the patterned sacrificial layer 151. Therefore, the patterned sacrificial layer 151 and the voids 143 have substantially the same shape. In addition, the patterned sacrificial layer 151 can have a height smaller than 800 Å, that is, the void 143 also has a height smaller than 800 Å.

Figure 4A:
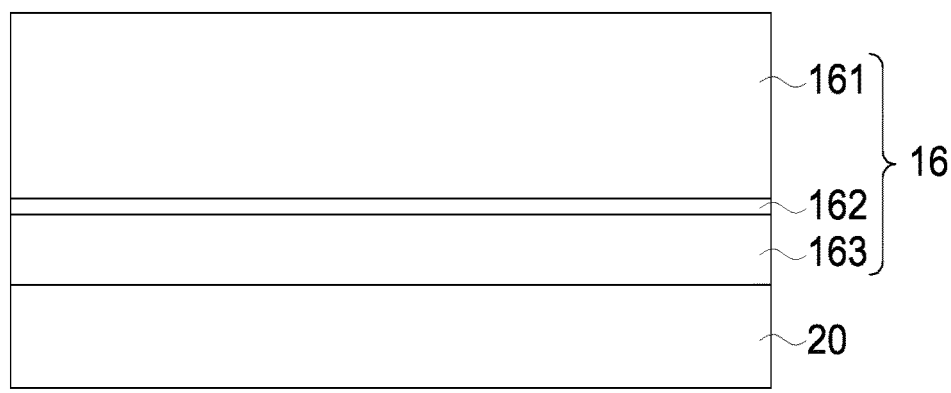
FIGS. 4A-4H are cross-sectional views illustrating a method of making a light-emitting device in accordance with another embodiment of the present disclosure.
Figure 4B:
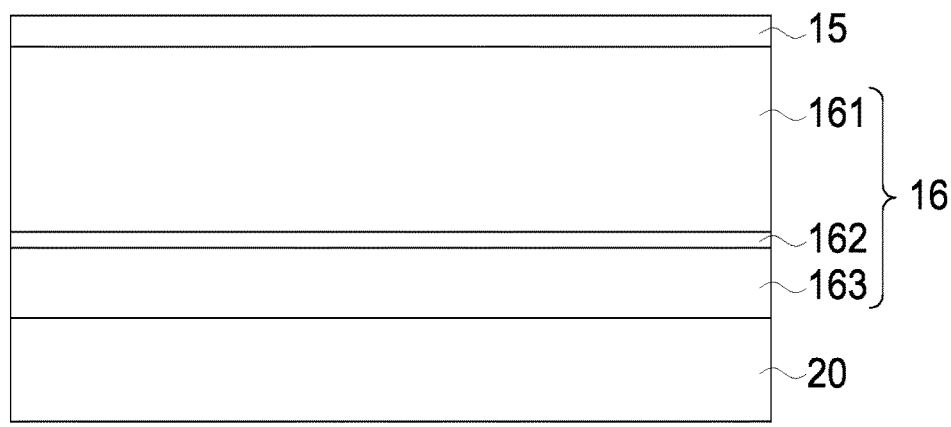
Figure 4C:
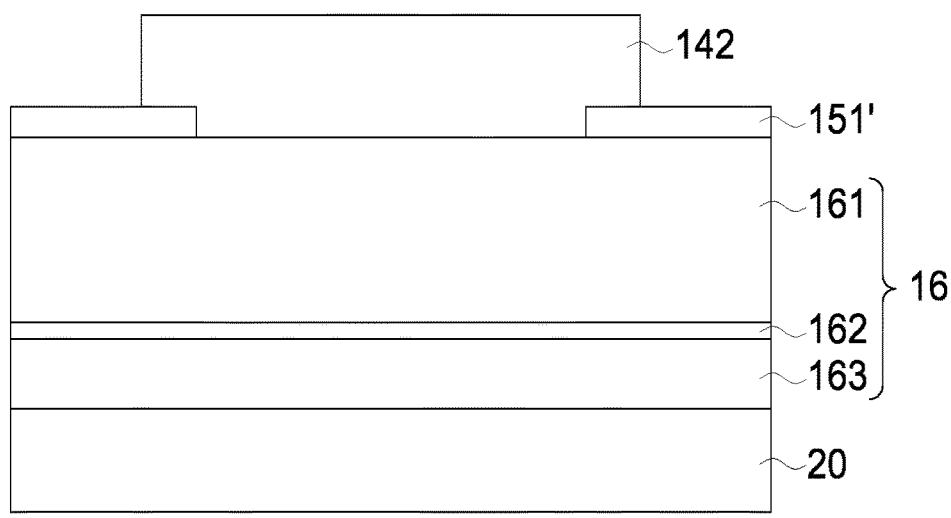
Figure 4D:
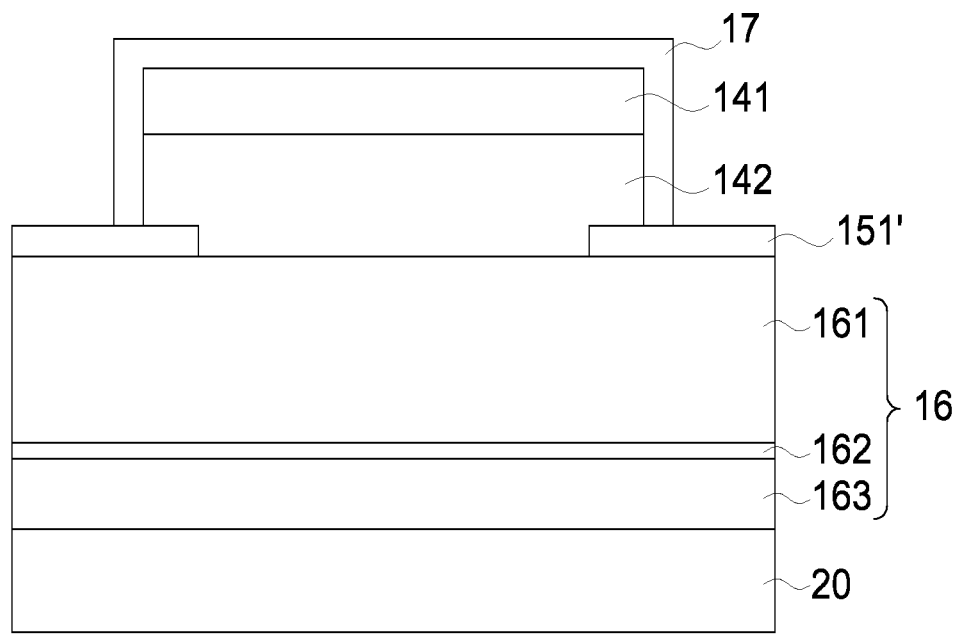
Figure 4E:
Figure 4F:
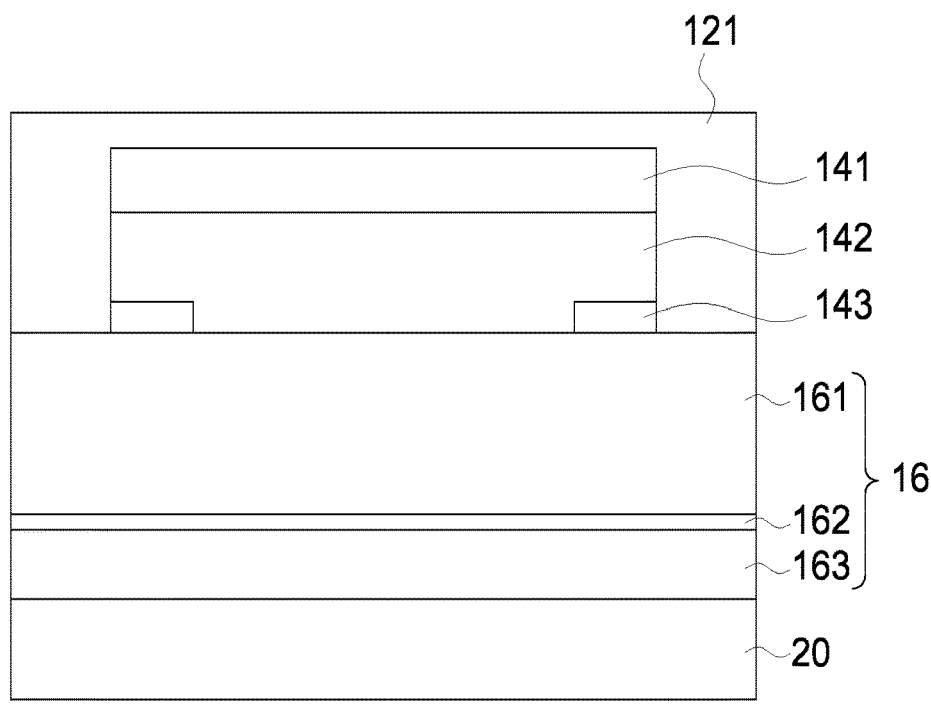
Figure 4G:
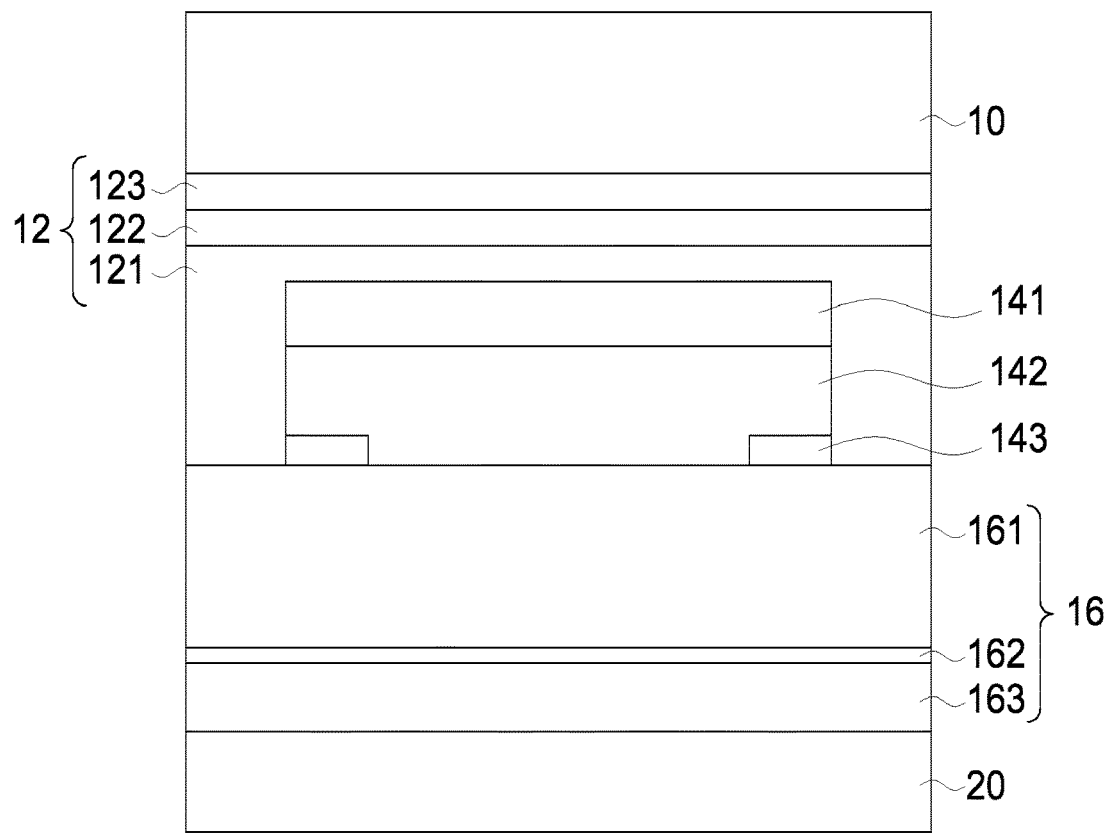
Figure 4H:
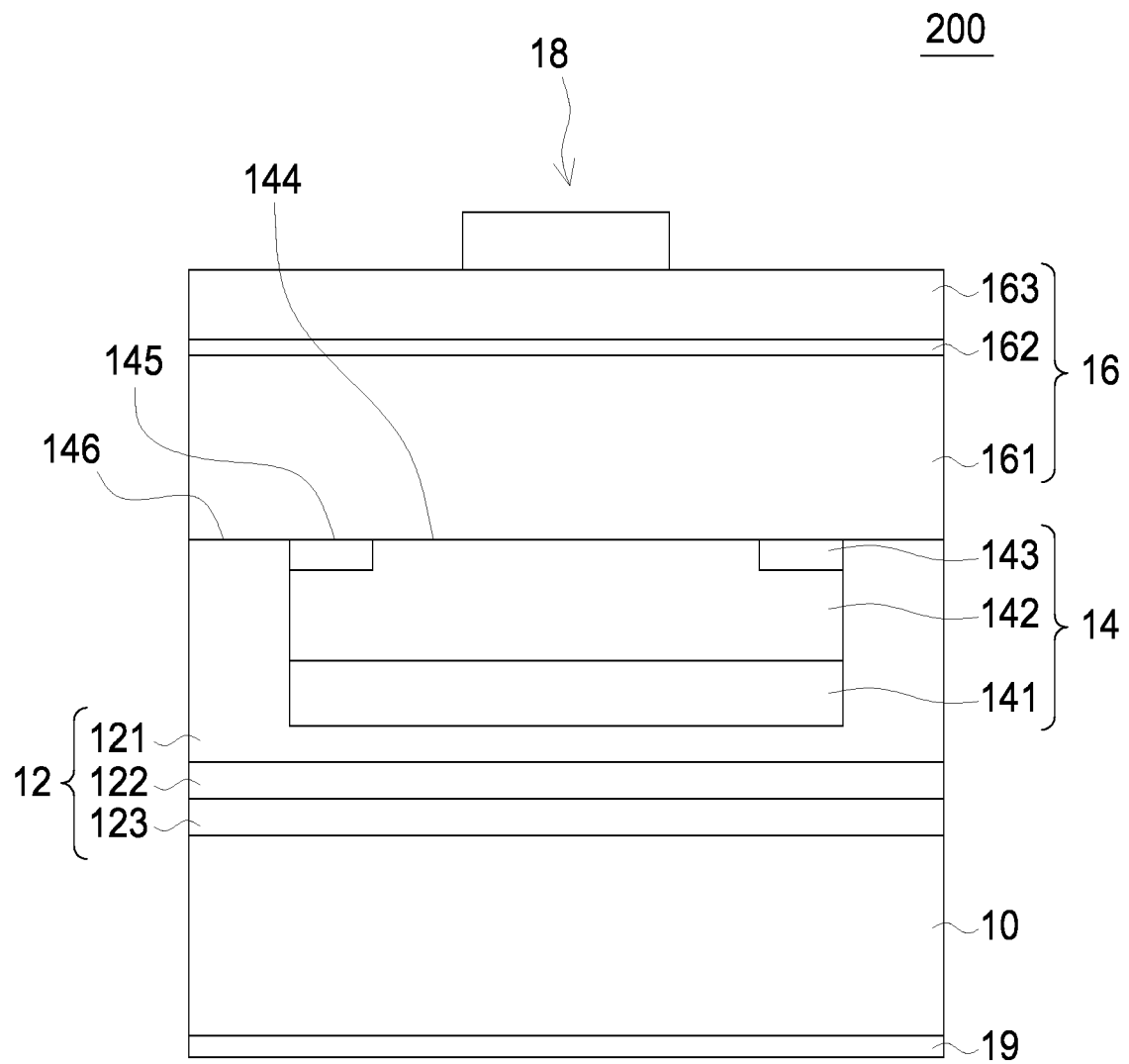

FIGS. 4A-4H are cross-sectional view showing a method of making the light-emitting device 200 in accordance with another embodiment of the present disclosure. The light-emitting device 200 has a structure similar with the light-emitting device 100. The devices, elements or steps with similar or the same symbols represent those with the same or similar functions. As shown in FIG. 4A, a growth substrate 20 (for example, GaAs) is provided and a light-emitting stack 16 is epitaxially grown on the growth substrate 20. The light-emitting stack 16 sequentially includes the second-type semiconductor layer 163 (for example, AlGaInP), the active layer 162 (for example, AlGaInP) and the first-type semiconductor layer 161 (for example, GaP). As shown in FIG. 4B, a sacrificial layer 15 (for example, SiO$_2$) is formed on the first-type semiconductor layer 161. As shown in FIG. 4C, a lithography process is conducted to pattern the sacrificial layer 15 for forming a patterned sacrificial layer 151'. A transparent conductive layer 142 (for example, ITO) is formed on a portion of the patterned sacrificial layer 151' and the first-type semiconductor layer 161, and the transparent conductive layer 142 does not fully enclose the patterned sacrificial layer 151 so another portion of the patterned sacrificial layer 151' is exposed. As shown in FIG. 4D, a metal layer 141 is formed on the transparent conductive layer 142. A protection layer 17 is formed to cover the transparent conductive layer 142 and a sidewall of the metal layer 141 and a portion of the exposed patterned sacrificial layer 151'. As shown in 4E, the patterned sacrificial layer 151' is removed using a vapor etching method (such as, vapor HF as etchant) to form the void 143. Subsequently, as shown in FIG. 4F, after removing the protective layer 17, the first bonding layer 121 is formed to cover or enclose a sidewall of the transparent conductive layer 142 and a sidewall of the metal layer 141, thereby the void 143 can be embedded within the first bonding layer 121 or between the first bonding layer 121 and the transparent conductive layer 142. The first bonding layer 121 can be a single layer or a multi-layer. In one embodiment, the first bonding layer 121 is a multi-layer (for example, Ti/Pt/Au). Ti layer can be used as a barrier layer to prevent the metal of the metal layer 141 from diffusing into the bonding layer; Pt layer can be used as an adhesion layer to improve adhesion between Ti layer and Au layer. As shown in 4G, by bonding the first bonding layer 121, the second layer 122, and the third bonding layer 123 together, the substrate 10 (for example, Si) is boned to the light-emitting stack 16. As shown in FIG. 4H, after removing the growth substrate 20, the first electrode 19 is formed on the substrate 10 and the second electrode 18 formed on the second-type semiconductor layer 163. In this embodiment, the second electrode 18 is not formed at a position corresponding to the voids 143. The first-type semiconductor layer 161 directly contacts the transparent conductive layer 142 to form the first interface 144, the first-type semiconductor layer 161 directly contacts the void 143 to form the second interface 145, and the first-type semiconductor layer 161 directly contacts the first bonding layer 121 to form a third interface 146. The void 143 does not directly contact the metal layer 141. Furthermore, the void 143 has a refractive index smaller than that of the transparent conductive layer 142 and that of the first bonding layer 121. In other word, a difference of the refractive index between the first-type semiconductor layer 161 and the transparent conductive layer 142 is smaller than that between the first-type semiconductor layer 161 and the void 143. A difference of the refractive index between the first-type semiconductor layer 161 and the first bonding layer 121 is smaller than that between the first-type semiconductor layer 161 and the void 143. Therefore, when the light emitted by the active layer 162 progresses toward the reflective structure 14, critical angles of the light at the first interface 144 and at the third interface 146 are larger than that at the second interface 145, that is, the probability occurring the total reflection at the second interface 145 is larger than at the first interface 144 and at the third interface 146. It is noted that when the active layer 162 emits a blue light with a peak wavelength of 430 nm-480 nm, the first bonding layer 121 has a refractive index for the blue light smaller than that that of the transparent conductive layer 142. For example, when the first bonding layer 121 is Ti or Pt, and the transparent conductive layer 142 is ITO, the first bonding layer 121 has the refractive index of 1.6-1.9 and the transparent conductive layer 142 has the refractive index of 2.0-2.3 which indicates the critical angle of the blue light at the first interface 144 is larger than that at the third interface 146. Therefore, the probability occurring the total reflection at the third interface 146 is larger than at the first interface 144. When the active layer 162 emits a red light with a peak wavelength of 630 nm-670 nm, the first bonding layer 121 has a refractive index for the red light larger than that that of the transparent conductive layer 142. For example, when the first bonding layer 121 is Ti or Pt, and the transparent conductive layer 142 is ITO, the first bonding layer 121 has the refractive index of 2.0-2.3 and the transparent conductive layer 142 has the refractive index of 1.7-1.9 which indicates the critical angle of the red light at the third interface 146 is larger than that at the first interface 144. Therefore, the probability occurring the total reflection for the red light at the first interface 144 is larger than at the third interface 146. Whatever the active layer 162 emits, the void 143 has a refractive index of about 1. In addition, the first-type semiconductor layer 161 ohmically contacts the transparent conductive layer 142 at the first interface 144; the first-type semiconductor layer 161 non-ohmically contacts the void 143 at the second interface 144; and the first-type semiconductor layer 161 non-ohmically contacts the first bonding layer 121 at the third interface 146.

Figure 5A:
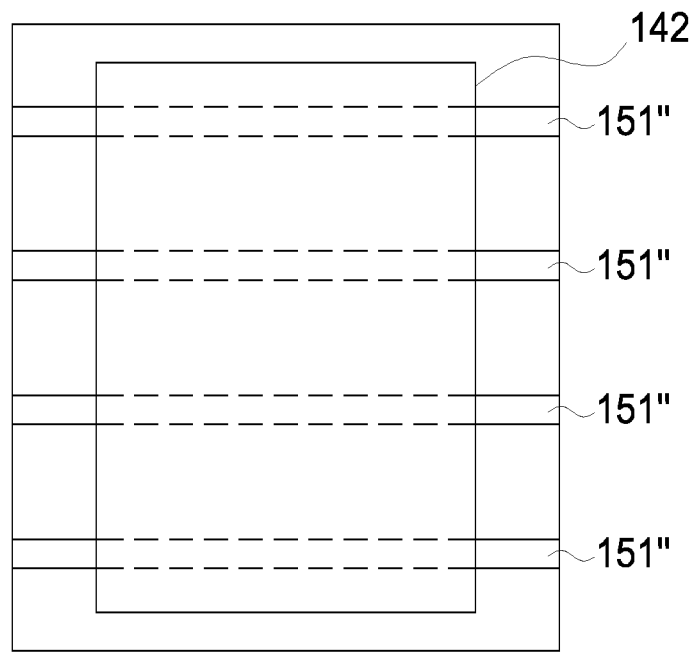
FIGS. 5A and 5B illustrate a top view of a patterned sacrificial layer and a transparent conductive layer.
Figure 5B:
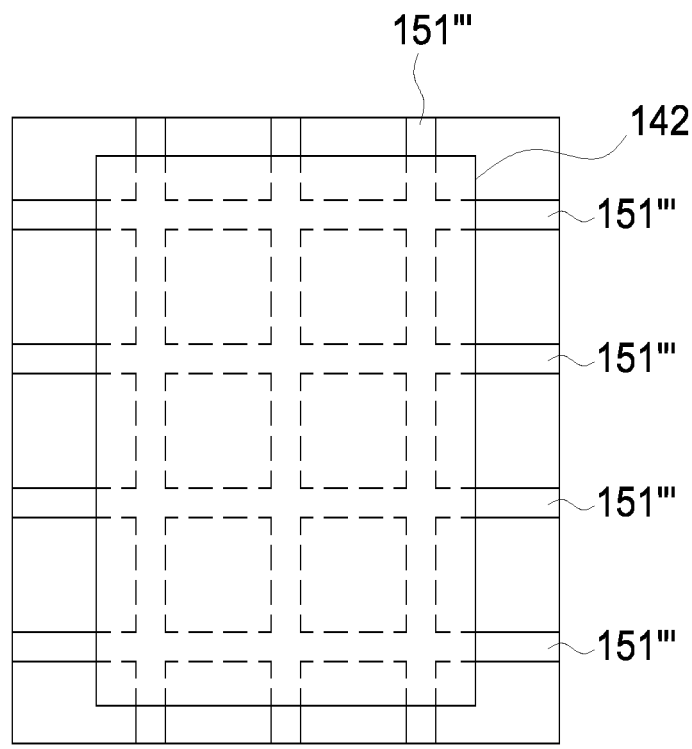

FIGS. 5A and 5B illustrate top views of the patterned sacrificial layer 151" and the transparent conductive layer 142 of a light-emitting device in accordance with an embodiment of the present disclosure. As shown in FIG. 5A, the patterned sacrificial layer 151" comprises a plurality of elongated structures and the transparent conductive layer 142 is formed on the elongated structures and covers portions of the elongated structures. As shown in FIG. 5B, the patterned sacrificial layer 151''' comprises a plurality of elongated structures perpendicular to each other to form a net structure. The transparent conductive layer 142 is formed on the net structure and covers portions of the net structure. In one embodiment, a surface area ratio of the patterned sacrificial layer 151", 151''' to the first-type semiconductor layer 161 ranges from 10% to 90%, or from 50% to 90%. However, the surface area, shape and quantity of the patterned sacrificial layer 151", 151''' can be varied depending on actual requirements. A surface area ratio of the transparent conductive layer 142 to the first-type semiconductor layer 161 ranges from 10% to 90%, or from 10% to 50%. It is noted that, based on the aforesaid description, since the void is formed by removing the sacrificial layer, the void has a substantially shape or structure same as that of the sacrificial layer. Therefore, the void has an elongated structure or a net structure.

Figure 6:
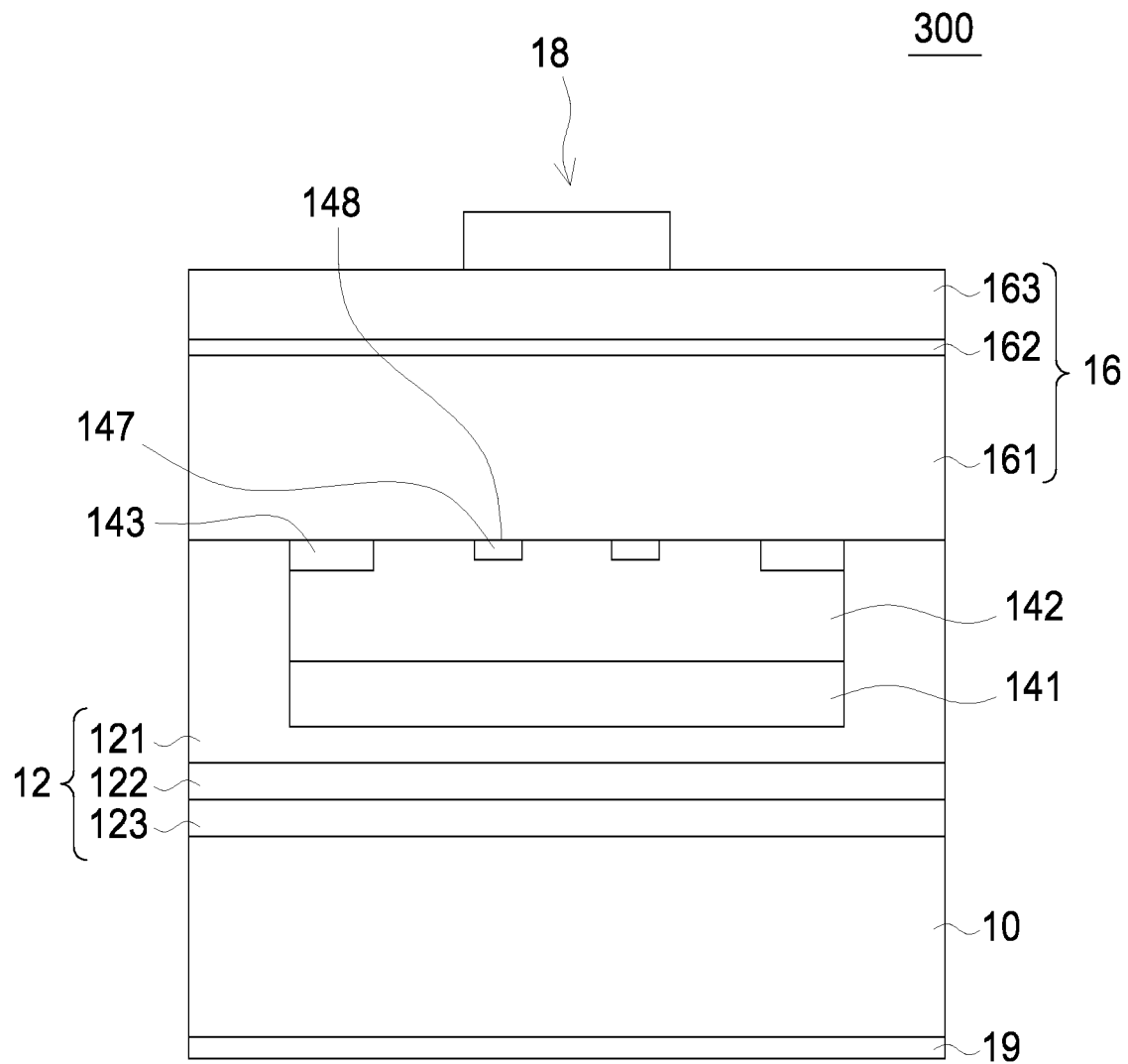
FIG. 6 illustrates a cross-sectional of a light-emitting device in accordance with another embodiment of the present disclosure.

FIG. 6 illustrates a cross-sectional view of a light emitting device 300 in accordance with an embodiment of the present disclosure. The light-emitting device 300 has a structure similar with the light-emitting device 200. The devices, elements or steps with similar or the same symbols represent those with the same or similar functions. In this embodiment, the light-emitting device 300 further comprises a contact layer 147 formed between the first-type semiconductor layer 161 and the transparent conductive layer 142 for spreading current. The contact layer 147 is enclosed or embedded within the transparent conductive layer 142, but does not directly contact the metal layer 141. In addition, the void 143 is formed between the contact layer 147 and the first bonding layer 121 and to surround the contact layer 147. The first-type semiconductor layer 161 directly contacts the contact layer 147 to form a fourth interface 148 and to form an ohmic contact therebetween. The contact layer 147 comprises metal or alloy. The metal comprises Cu, Al, In, Sn, Au, Pt, Zn, Ag, Ti, Ni, Pd, Pb or Cr; and the alloy can be Be—Au, Ge—Au, Cr—Au, Ag—Ti, Cu—Sn, Cu—Zn, Cu—Cd, Sn—Pb—Sn, Sn—Pb—Zn, Ni—Sn, or Ni—Co.

Figure 7:
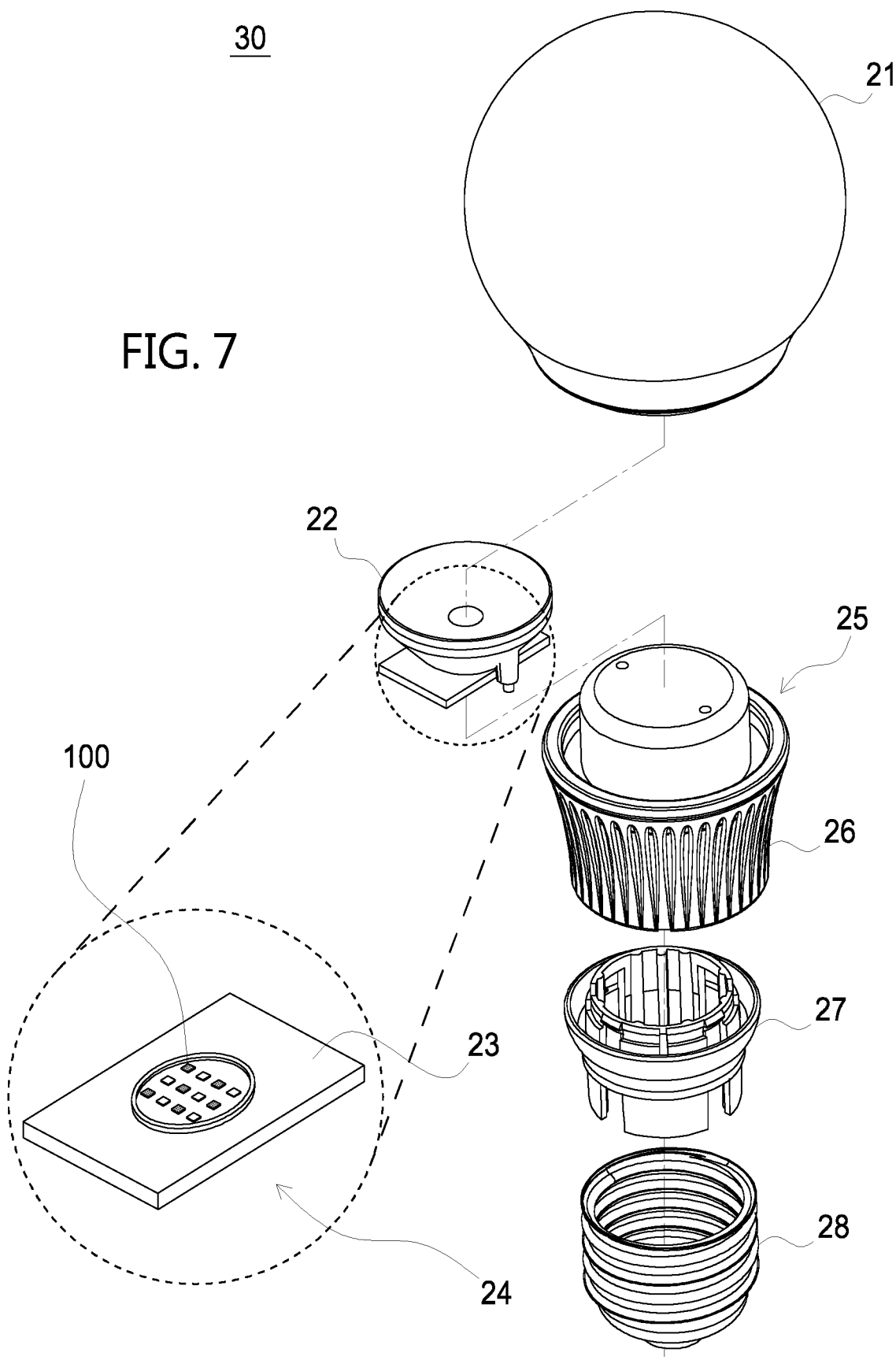
FIG. 7 illustrates an explorer view of a blub using the light-emitting device.

FIG. 7 is an explorer view of a bulb 30 using the previously described light-emitting device. The bulb 30 comprises a cover 21, a lens 22, a light-emitting module 24, a holder 25, a heat sink 26, a connector 27, and a circuit element 28. The light-emitting module 24 includes a carrier 23 and a plurality of light-emitting unit. The light-emitting device previously described (such as the light-emitting device 100, 200 or 300) can be used as the light-emitting unit. As shown in FIG. 7, twelve light-emitting units are disposed on the carrier 23 wherein there are six red light-emitting units emitting red light and six blue light-emitting units emitting blue light. The twelve light-emitting units are alternately arranged and electrically connected to each other (in a series connection, in a parallel connection or a bridge connection). The blue light-emitting units comprise a wavelength conversion material formed thereon for converting the blue light. The blue light and the converted light are mixed to become a white light, and further to combine with the red light-emitting units to make the bulb 30 emit a warm white light having a color temperature of 2400K-3000K.

The foregoing description has been directed to the specific embodiments of this invention. It will be apparent to those having ordinary skill in the art that other alternatives and modifications can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device, comprising:
a substrate;
a bonding structure on the substrate and comprising a first bonding layer;
a light-emitting stack on the bonding structure and having a first-type semiconductor layer, a second-type semiconductor layer, and an active layer between the first-type semiconductor layer and the second-type semiconductor layer;
a reflective structure between the first-type semiconductor layer and the substrate and having a first interface and a second interface; and
a void embedded within the first bonding layer; and
a contact layer between the first-type semiconductor layer and the reflective structure;
wherein a critical angle at the first interface for a light emitted from the light-emitting stack is larger than that at the second interface.

2. The light-emitting device of claim 1, wherein the reflective structure comprises a metal layer with a first side wall covered by the first bonding layer.

3. The light-emitting device of claim 2, wherein the contact layer does not contact the metal layer.

4. The light-emitting device of claim 1, wherein the bonding structure further comprising a second bonding layer between the first bonding layer and the substrate.

5. The light-emitting device of claim 4, wherein the reflective structure comprises a metal layer with a first side wall and the second bonding layer does not cover the first side wall.

6. The light-emitting device of claim 2, wherein the metal layer further comprises a second side wall and a bottom surface, and the second side wall and the bottom surface are covered by the first bonding layer.

7. The light-emitting device of claim 1, wherein the bonding structure is connected to the reflective structure.

8. The light-emitting device of claim 2, wherein the reflective structure further comprises a transparent conductive layer between the light-emitting stack and the metal layer.

9. The light-emitting device of claim 8, wherein the transparent conductive layer has a first side surface covered by the first bonding layer.

10. The light-emitting device of claim 9, wherein the transparent conductive layer further has a second side surface covered by the first bonding layer.

11. A light-emitting device, comprising:
a substrate;
a bonding structure on the substrate and comprising a first bonding layer;
a light-emitting stack on the bonding structure and having a first-type semiconductor layer, a second-type semiconductor layer, and an active layer between the first-type semiconductor layer and the second-type semiconductor layer;
a reflective structure between the first-type semiconductor layer and the substrate and comprising a metal layer and a transparent conductive layer between the first-type semiconductor layer and the metal layer; and
a void embedded within the first bonding layer; and
a contact layer between the first-type semiconductor layer and the reflective structure;
wherein the reflective structure directly connects to the light-emitting stack, the metal layer has a first side wall, a second side wall and a bottom surface, and the first side wall, the second side wall and the bottom surface are covered by and directly contact the first bonding layer.

12. The light-emitting device of claim 11, wherein the metal layer comprises metal or alloy.

13. The light-emitting device of claim 11, wherein the contact layer does not contact the metal layer.

14. The light-emitting device of claim 11, further comprising a first electrode on the second-type semiconductor layer.

15. The light-emitting device of claim 14, wherein the first electrode does not overlap with the void in a vertical direction.

16. The light-emitting device of claim 11, wherein the transparent conductive layer has a first side surface and a second side surface, wherein the first side surface and the second side surface are covered by and directly contact the first bonding layer.

17. The light-emitting device of claim 14, further comprising a second electrode under the substrate.

18. The light-emitting device of claim 11, further comprising a second bonding layer between the first bonding layer and the substrate.

19. The light-emitting device of claim 11, wherein the first bonding layer comprises a metal material or a glue material.

20. A light-emitting module, comprising;
a carrier; and
a plurality of light-emitting units on the carrier;
wherein one of the light-emitting units is the light-emitting device of claim 1.

* * * * *